(12) United States Patent
Kuboi

(10) Patent No.: US 7,859,070 B2
(45) Date of Patent: Dec. 28, 2010

(54) AIRTIGHT APPARATUS HAVING A LID WITH AN OPTICAL WINDOW FOR PASSAGE OF OPTICAL SIGNALS

(75) Inventor: Toru Kuboi, Machida (JP)

(73) Assignee: Olympus Corporation, Tokyo (JP)

( * ) Notice: Subject to any disclaimer, the term of this patent is extended or adjusted under 35 U.S.C. 154(b) by 271 days.

(21) Appl. No.: 11/950,863

(22) Filed: Dec. 5, 2007

(65) Prior Publication Data

US 2008/0134631 A1 Jun. 12, 2008

(30) Foreign Application Priority Data

Dec. 6, 2006 (JP) .............................. 2006-329568

(51) Int. Cl.
*H01L 21/76* (2006.01)
*H01L 21/44* (2006.01)
(52) U.S. Cl. .................. 257/431; 257/432; 257/433; 257/434; 257/435
(58) Field of Classification Search .......... 257/431–435
See application file for complete search history.

(56) References Cited

U.S. PATENT DOCUMENTS 6,483,030 B1 * 11/2002 Glenn et al. ................ 174/521
6,639,313 B1 * 10/2003 Martin et al. ............... 257/704
6,894,853 B2 * 5/2005 Haskett et al. .............. 359/894

FOREIGN PATENT DOCUMENTS

| JP | 03-81077 | 4/1991 |
| JP | 08-118043 | 5/1996 |
| JP | 3391123 | 1/2003 |
| JP | 2005-191313 | 7/2005 |
| JP | 2006-222249 | 8/2006 |

OTHER PUBLICATIONS

Japanese Office Action dated Mar. 23, 2010 with translation.
Japanese Office Action with English-language translation dated Jun. 8, 2010.
Japanese Office Action with English-language translation dated Aug. 24, 2010.

* cited by examiner

*Primary Examiner*—Matthew C Landau
*Assistant Examiner*—James M Mitchell
(74) *Attorney, Agent, or Firm*—Scully, Scott, Murphy & Presser, P.C.

(57) ABSTRACT

An airtight apparatus includes a package and a lid. The lid is bonded to the package and defines an airtight space, together with the package. The lid includes an optical window which allows the passage of optical signals, a holding part which holds the optical window, and a deformable part which is formed on an outer circumferential edge of the holding part and which is able to deform when applied with a load smaller than a load that deforms the holding part.

15 Claims, 5 Drawing Sheets

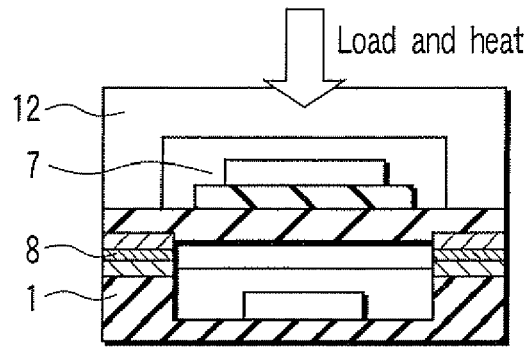
F I G. 4
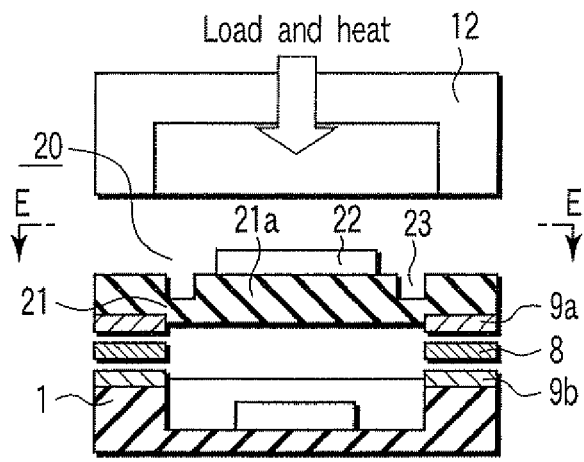
F I G. 5A
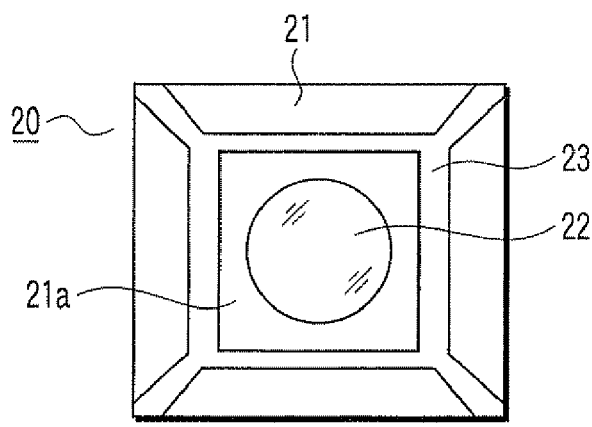
F I G. 5B

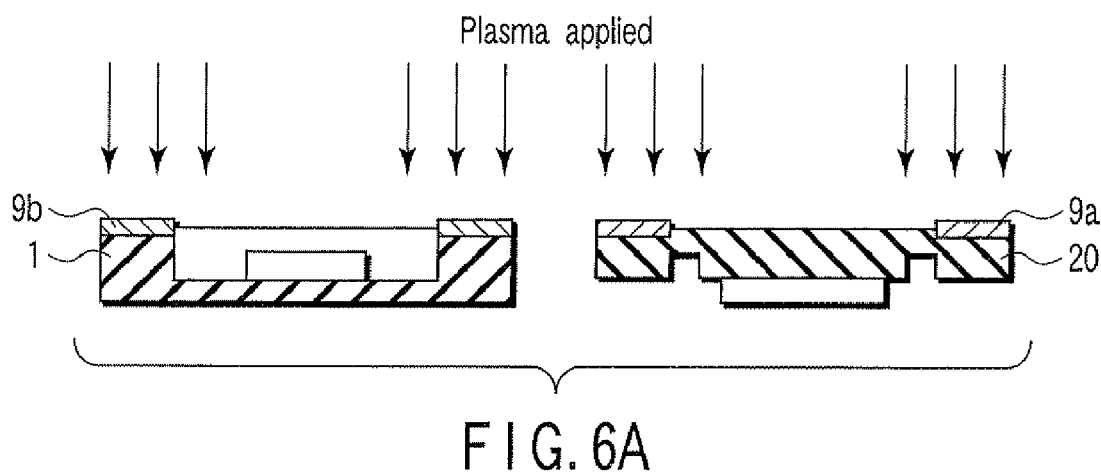
F I G. 6A
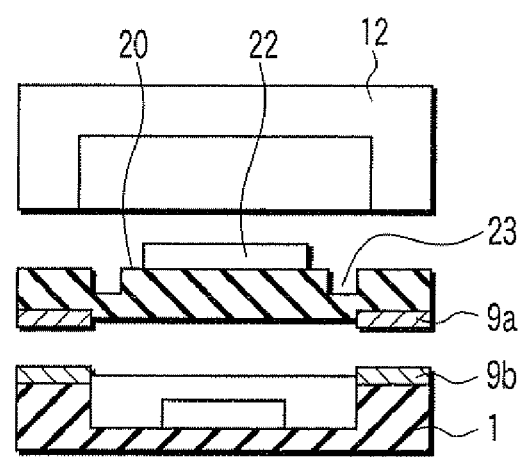
F I G. 6B
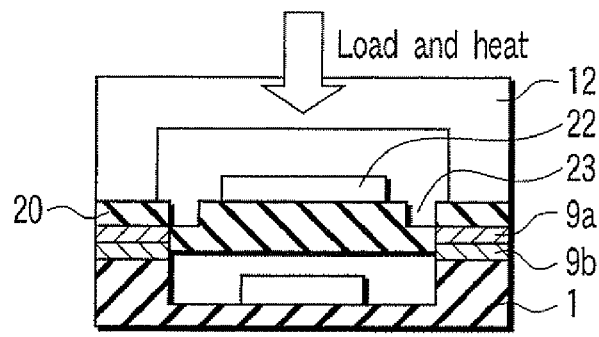
F I G. 6C

AIRTIGHT APPARATUS HAVING A LID WITH AN OPTICAL WINDOW FOR PASSAGE OF OPTICAL SIGNALS

CROSS-REFERENCE TO RELATED APPLICATIONS

This application is based upon and claims the benefit of priority from prior Japanese Patent Application No. 2006-329568, filed Dec. 6, 2006, the entire contents of which are incorporated herein by reference.

BACKGROUND OF THE INVENTION

1. Field of the Invention

The present invention relates to an airtight apparatus that comprises a package, a lid having an optical window, and an electronic device, the package and the lid bonded together, sealing the device in airtight fashion.

2. Description of the Related Art

In recent years, new apparatuses have been developed, each having a chip or substrate which is designed for use in optical communication apparatuses and optical apparatuses, such as microscopes, and which has additional components, such as lenses and mirrors, so that the apparatuses may have less components, be smaller and perform more functions. Of these apparatuses, many should be airtight-sealed and filled with inert gas or should be vacuum-sealed so that they may operate reliably or their functions may be fully performed. To achieve the airtight sealing, brazing material, particularly solder, i.e., a soft brazing material, is used in some cases. Instead of solder, flux may be used. But it is not desirable to use flux, because it may generate out gases. If solder is used, however, it may not well wet the members that are to be sealed together. That is, in this case, desirable alloy layers can hardly be formed, rendering it difficult to accomplish satisfactory airtight sealing. Therefore, there is a demand for a solder-sealing technique that can increase the wetting of solder, thereby to accomplish sufficient airtight sealing.

Airtight-sealing techniques designed to increase the wetting of solder is disclosed in, for example, Japanese Patent No. 3391123. The technique disclosed in Japanese Patent No. 3391123 will be briefly described, with reference to FIG. 7.

As FIG. 7 shows, a substrate 101 and a cap 103 define a space, in which a G sensor 105 mounted on the substrate 101 can be contained. The cap 103 is coated with solder 104, and a wire 102 is provided on the substrate 101. A heater tool 106 applies heat and pressure to the cap 103, melting solder 104 between the substrate 101 and the cap 103. The solder 104 therefore bonds the substrate 101 and cap 103 together in airtight fashion. In the technique described in the specification of Japanese Patent No. 3391123, the load exerted from the heater tool 106 to the cap 103 is of such a value that breaks the oxide films formed on the wire 102 and the solder 104, respectively. Thus, the load breaks the oxide films and achieves solder bonding, without degrading the wetting of the solder, which would occur if the oxide films would remain. As a result, the air-tightness of the sealing can be enhanced.

BRIEF SUMMARY OF THE INVENTION

According to a first aspect of the present invention, there is provided an airtight apparatus comprising: a package; and a lid which is bonded to the package and defines an airtight space, together with the package, and which includes: an optical window which allows the passage of optical signals; a holding part which holds the optical window; and a deformable part which is formed on an outer circumferential edge of the holding part and which is able to deform when applied with a load smaller than a load that deforms the holding part.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 4 is a third diagram showing the sequence of the bonding process performed to manufacture the airtight apparatus;

FIGS. 5A and 5B are diagrams showing the configuration of an airtight apparatus according to a second embodiment of the present invention;

FIGS. 6A, 6B and 6C are diagrams showing the configuration of an airtight apparatus according to a third embodiment of the present invention.

DETAILED DESCRIPTION OF THE INVENTION

Embodiments of the present invention will be described, with reference to the accompanying drawings.

First Embodiment

Figure 1A:
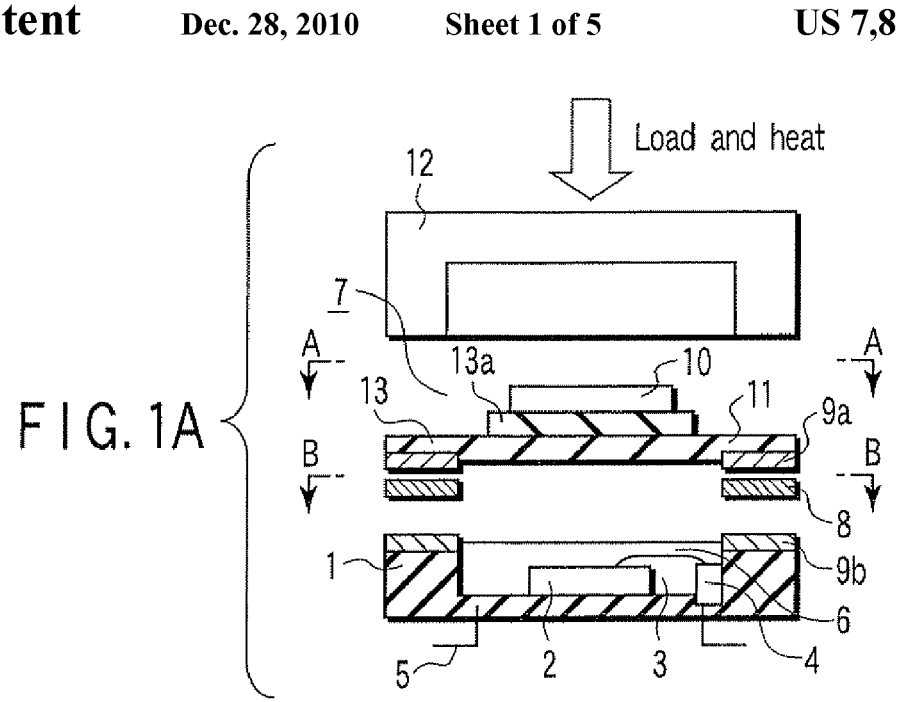
FIGS. 1A, 1B and 1C are diagrams showing the configuration of an airtight apparatus according to a first embodiment of the present invention.
Figure 1B:
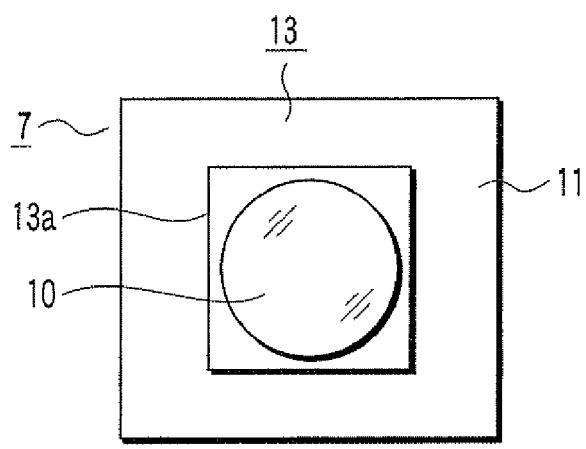
Figure 1C:
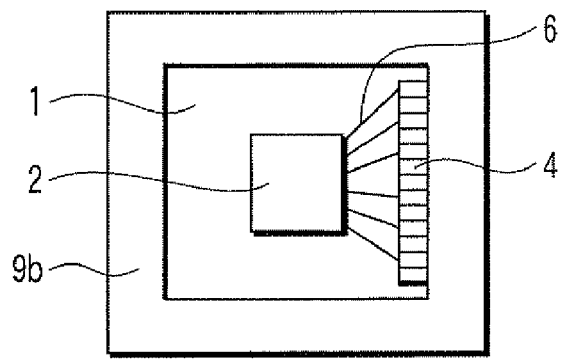

FIGS. 1A to 1C are diagrams showing the configuration of an airtight apparatus according to a first embodiment of the present invention. FIG. 1A is a sectional view depicting the configuration of the airtight apparatus according to the first embodiment of this invention. FIG. 1B is a sectional view taken along line A-A shown in FIG. 1A. FIG. 1C is a sectional view taken along line B-B shown in FIG. 1A. As shown in FIG. 1A, the airtight apparatus comprises a package 1 and a lid 7. The package 1 and the lid 7 are positioned, opposing to each other, and are bonding to each other by a bonding material 8. Metal films 9a and 9b are formed on the frame 13 of the lid 7 and the package 1, respectively. The metal films 9a and 9b fuse with the bonding material 8, forming alloy, whereby the package 1 and the lid 7 are bonded together. The bonding material 8 may be made of soft brazing material such as SnAgCu solder, SnZn solder, SnBi solder or SnIn solder. The metal films 9a and 9b may be of any composition that can from an alloy with the solder. The metal films 9a and 9b are, for example, Ni/Au films formed by electroplating or sputtering (each composed of an Au layer that contacts the bonding material 8, and an Ni layer that contacts the package 1 or the lid 7).

The package 1 has a cavity 3, in which a device 2 is held. The cavity 3 holds a pad 4, which is provided to achieve electrical connection with the outer side of the package 1 (which is not sealed). On the outer side of the package 1, a lead wire 5 is provided and electrically connected to the pad 4. A bonding wire 6 electrically connects the device 2 to the pad 4. The lead 5 connects the device 2 to an electrical circuit (not shown) that is provided outside the airtight apparatus. Thus, power can be supplied to the device 2 provided in the package 1 and the device 2 can be driven.

The lid 7 comprises an optical window 10 and a frame 13. The optical window 10 is made of transparent material and allows the passage of optical signals. The frame 13 has a holding part 13a that holds the optical window 10. The holding part 13a of the frame 13 is surrounded by a deformable part 11. The deformable part 11 is thinner than the holding part 13a and can therefore deform more easily than the holding part 13a. Thus, the deformable part 11 deforms when exerted with a load smaller than the load that can deform the holding part 13a. The deformable part 11 formed integral with the frame 13 of the lid 7 should be similar in shape to the metal film 9b that is opposed to the deformable part 11, as shown in FIGS. 1B and 1C, (though it differs in size from the metal film 9b).

To bond the package 1 and the lid 7, a heater tool 12 is arranged above the lid 7 (that is, on the side at which the optical window 10 is provided) and can be moved up and down. The heater tool 12 can be heated to a predetermined temperature at which the bonding material 8 melts. The heater tool 12 can contact the lid 7 in order to apply a load to the lid 7.

At least that part of the package 1, on which the metal film 9b is formed, should have as high a surface flatness as possible. However, the surface-flatness of the package 1 may decrease during the manufacture of the package 1. For example, if the package 1 is made of ceramic, it may warp when it is cooled after made by sintering performed at high temperatures.

FIG. 1A shows a structure, in which the package 1 has a cavity 3. Instead, the lid 7 may have the cavity 3. Alternatively, both the package 1 and the lid 7 may have a cavity.

The device 2 arranged in the package 1 may be electrically connected to the bonding wire 6, not by wire bonding but by flip-chip bonding.

Further, the deformable part 11 may be thin at the upper surface or lower surface of the frame 13, or at both the upper and lower surfaces thereof.

A method of bonding the package 1 and the lid 7 together to provide an airtight apparatus according to the first embodiment will be explained with reference to FIG. 2, FIGS. 3A and 3B and FIG. 4. These figures are sectional views showing the same cross section as shown in FIG. 1, but do not illustrate some of the components shown in FIG. 1.

Step 1: The bonding material 8 is placed on the metal film 9b formed on the package 1, at a prescribed position.

Figure 2:
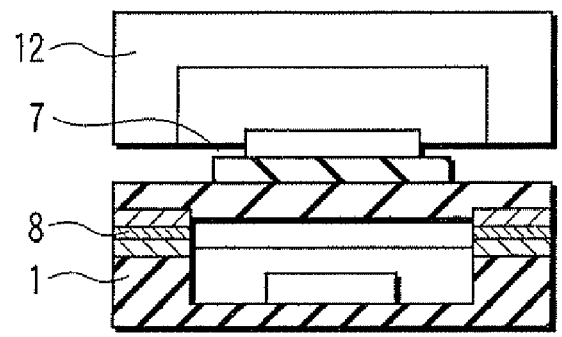
FIG. 2 is a first diagram showing the sequence of a bonding process performed to manufacture the airtight apparatus.

Step 2: As shown in FIG. 2, the lid 7 is set on the package 1, at a prescribed position. The bonding material 8 is thereby held between the metal film 9b formed on the package 1 and the metal film 9a formed on the package 1.

Figure 3A:
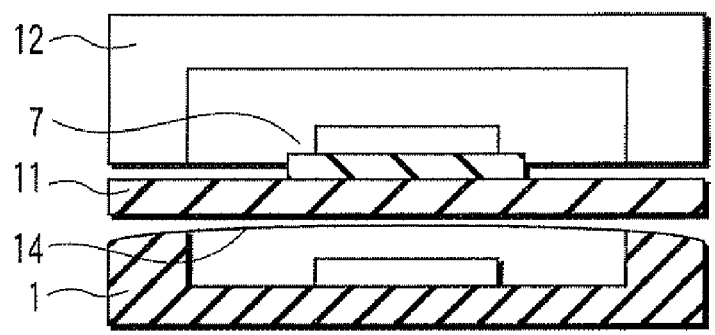
FIGS. 3A and 3B are a second diagram showing the sequence of the bonding process performed to manufacture the airtight apparatus.
Figure 3B:
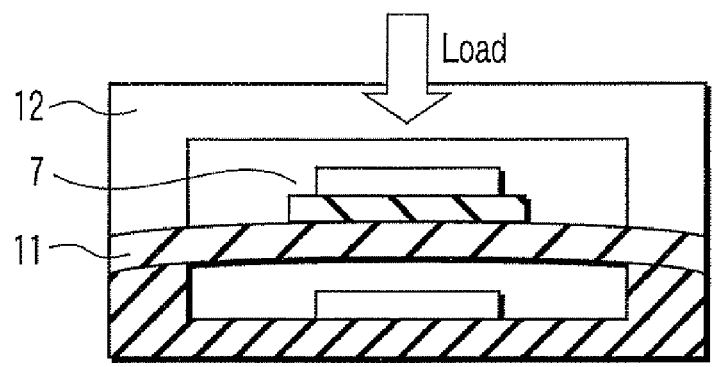
Figure 7:
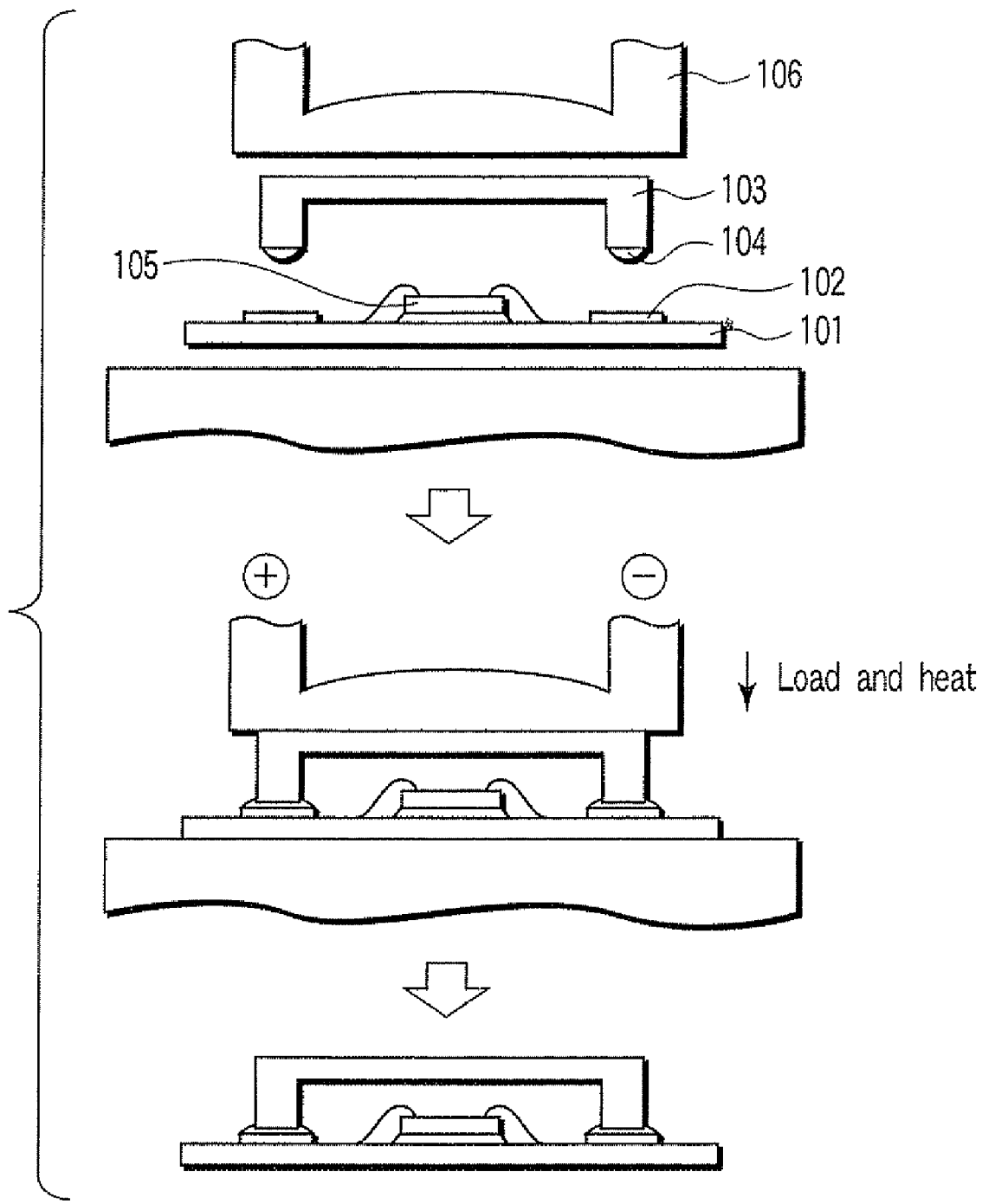
FIG. 7 is a diagram showing the configuration of a conventional airtight apparatus.

Step 3: As shown in FIG. 3A, the heater tool 12 is lowered by means of a lift mechanism (not shown), exerting a predetermined load to the lid 7. As described above, the package 1 may have its surface flatness decreased during its manufacture. The package 1 shown in FIG. 3A has a warping surface 14, with the center at the highest level and the outer edge at the lowest level (warping like the surface of a convex lens). Nevertheless, the deformable part 11 deforms in conformity to the warping surface 14 of the package 1 in the first embodiment, by virtue of the load that the heater tool 12 exerts to the deformable part 11. Since the deformable part 11 is thinner than the holding part 13a of the frame 13 and can easily deform, the stress applied to the optical window 10 from the heat tool 12 is moderated and will not break the lid 7. Moreover, since the deformable part 11 can easily deform, a load can be applied to the bonding material 8 and the metal films 9a and 9b, which is large enough to break the oxide films existing on the surfaces of the bonding material 8 and metal films 9a and 9b.

Step 4: As FIG. 4 shows, the heater tool 12 is heated to a desired temperature by using a control circuit (not shown). Since the heater tool 12 contacts the lid 7, applying a desired load the lid 7, it heats the lid 7. As a result, the bonding material 8 that abuts on the lid 7 is heated, too, and eventually melts. At this time, the load breaks the oxide films, and the bonding material 8 acquires sufficient wetting property, forming a desirable metal layer that has only a few voids. The package 1 and the lid 7 can therefore be bonded together, providing a sufficiently airtight space.

Step 5: After heating the lid 7 to the desired temperature for a desired time, the heat tool 12 is stopped, cooling the lid 7. The bonding material 8 is thereby cooled to a desired temperature and solidified. If necessary, a cooling mechanism (not shown) may be used to cool the lid 7, in order to change the cooling profile in this method.

Step 6: The lift mechanism (not shown) is driven, moving the heater tool 12 upwards. Then, the airtight apparatus having the package 1 and the lid 7 now bonded together is removed from the boding position.

In Step 1 of the method, the bonding material 8 is placed on the metal film 9b formed on the package 1. Instead, the bonding material 8 may be provided beforehand on the metal film 9b formed on the package 1. Further, the bonding material 8 may be laid on the metal film 9a formed on the lid 7, not the metal film 9b formed on the package 1. Alternatively, two bonding materials may be provided on the metal films 9a and 9b, respectively.

As has been described, the deformable part 11 formed on the frame 13 of the lid 7 easily deforms in conformity to the warping surface 14 of the package 1 when applied with a load from the heater tool 12, in the first embodiment. Therefore, the load is hardly applied from the heater tool 12 to the holding part 13a of the frame 13. A sufficient load can therefore be exerted to the junction between the package 1 and the lid 7, without damaging the lid 7 though the lid 7 has the optical window 10 and is therefore fragile. Even if the package 1 warps, inevitably reducing the flatness of the metal film 9b, the metal oxide film existing on the bonding material 8 or metal film 9b can be broken to ensure the wetting of the bonding material 8. A desirable bonding alloy layer that has few voids, if any, can therefore be formed. This helps to provide an airtight apparatus enhanced in terms of air-tightness, at a high yield and, hence, at a low manufacturing cost.

Further, the deformable part 11 can deform when applied with a load that is smaller than the load that can deform the holding part 13a and can be less elastically restored to the initial shape than the holding part 13a. This enhances the reliability of the bonding of the package 1 and lid 7. Moreover, when the package 1 and the lid 7 are bonded, a load is scarcely exerted to any component near the optical window 10, though the deformable part 11 deforms in conformity to the warping surface 14 of the package 1. Hence, the deformation of the component near the optical window 10 is minimized. This improves the optical characteristics of the airtight apparatus.

Second Embodiment

A second embodiment of the present invention will be described with reference to FIGS. 5A and 5B. FIG. 5A is a sectional view of an airtight apparatus according to the second embodiment. FIG. 5B is a plan view taken along line E-E shown in FIG. 5A. The components identical to those of the first embodiment are designated by the same reference numbers in FIG. 5A and 5B and will not be described in detail.

In the second embodiment, a lid 20 is used, which is equivalent to the lid 7 of the first embodiment. The lid 20 is composed of a frame 21 and an optical window 22. The frame 21 has a holding part 21a, which holds the optical window 22. As FIGS. 5A and 5B show, the frame 21 has a deformable part 23, or a grooved part, which is made in the upper surface of the frame 21. Instead, the deformable part 23 may be made in the lower surface of the frame 21, or two deformable parts may be made in the upper and lower surfaces of the frame 21, respectively.

The deformable part 23 need not be defined by one continuous groove. It may be defined by a plurality of grooves. In this case, too, the grooves should be symmetrical with respect to the optical window 22 and be similar in shape to the metal film 9b provided on the package 1 and opposed to the deformable part 23 (though it differs in size from the metal film 9b).

The package 1 and lid 20 of the second embodiment are bonded to each other in the same way as in the first embodiment. Therefore, the method of bonding the package 1 and the lid 20 together will not be described.

As may be understood from the above, the second embodiment achieves the same advantages as the first embodiment. In addition, the deformable part 23 can be provided in a shorter time than in the first embodiment, because it can made merely by performing a mechanical process of cutting a groove. This helps to shorten the time of producing a frame having a deformable part, thereby to reduce the price of the frame. Ultimately, this can provide an airtight apparatus at a low manufacturing cost.

Third Embodiment

A third embodiment of the present invention will be described with reference to FIGS. 6A to 6C. The components identical to those of the first and second embodiments are designated by the same reference numbers in FIGS. 6A to 6C and will not be described in detail.

As shown in FIG. 6C, a lid 20 is positioned with respect to a package 1, inserting no bonding materials between the package 1 and the lid 20. Metal films 9a and 9b are formed on the package 1 and the lid 20, respectively. The metal films 9a and 9b are, for example, Ni/Au films (each composed of an Ni layer that contacts the package 1 or the lid 20 and an Au layer that contacts the Ni layer).

A method of bonding the package 1 and the lid 20 together to provide an airtight apparatus according to the third embodiment will be explained below, with reference to FIGS. 6A to 6C.

Step 1: The package 1 and the lid 20 are inserted into a plasma cleaner (not shown). In the plasma cleaner, an energy wave, such as Ar plasma, is applied to the metal films 9a and 9b formed on the lid 20 and the package 1, respectively, thereby cleaning the surface of each metal film. Thus, oxides and organic substances are removed from the metal films 9a and 9b. As a result, the atoms constituting the films 9a and 9b are exposed.

Step 2: The package 1 and the lid 20 are removed from the plasma cleaner. As shown in FIG. 6B, the lid 20 is positioned with respect to the package 1, opposing the metal film 9a formed on the lid 20 to the metal film 9b formed on the package 1.

Step 3: As shown in FIG. 6C, a heater tool 12 is lowered by means of a lift mechanism (not shown) exerting a predetermined load to the lid 20. The load deforms the deformable part 23 of the lid 20, which deforms more easily than the holding part 21a. This moderates the stress applied to the optical window 22 of the lid 20. Thus, a load can be exerted on the lid 20, without breaking the lid 20. Since the deformable part 23 easily deforms, the metal films 9a and 9b formed on the lid 20 and package 1, respectively, can be firmly bonded to each other. More precisely, the metal films 9a and 9b are bonded to each other by virtue of the inter-atomic force generated between the exposed atoms of the film 9a and those of the film 9b.

Step 4: After Step 3, the heater tool 12 is heated to a desired temperature by using a control circuit (not shown), if necessary. The coupling force between the exposed atoms of the metal film 9a and those of the metal film 9b is thereby activated. As a result, the metal films 9a and 9b are more firmly coupled to each other because of the strong inter-atomic force.

Step 5: After heating the lid 20 to the desired temperature for a desired time, the heat tool 12 is stopped, cooling the lid 20. If necessary, a cooling mechanism (not shown) may be used to cool the lid 7, in order to change the cooling profile in this method.

Step 6: Finally, the lift mechanism (not shown) is driven, moving the heater tool 12 upwards. Then, the airtight apparatus having the package 1 and the lid 20 now bonded together is removed from the boding position. The bonding process is then terminated.

As may be understood from the above, the third embodiment achieves the same advantages as the second embodiment. In addition, the package 1 and the lid 20 can be directly bonded to each other. Since a member of different metal, such as the bonding material 8, need not be used, a more reliable airtight sealing can be accomplished. This helps to manufacture an airtight apparatus at a high yield and, hence, at a lower cost.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An airtight apparatus comprising:
   a package; and
   a lid which is bonded to the package and defines an airtight space, together with the package, and which includes:
   an optical window which allows the passage of optical signals;
   a holding part which holds the optical window; and
   the holding part having a thinner portion which is formed on an entire outer circumferential edge of the holding part and which is able to deform when applied with a load smaller than a load that deforms other portions of the holding part;

wherein the thinner portion is arranged symmetrical with respect to the optical window and a metal film is formed on the lid at a position where the lid abuts on a metal film formed.

2. The airtight apparatus according to claim 1, wherein the metal film formed on the lid is composed of a base layer, an Ni layer formed on the base layer, and an Au layer formed on the Ni layer.

3. The airtight apparatus according to claim 1, wherein a brazing layer used as a bonding material is interposed between the metal film formed on the package and the metal film formed on the lid.

4. The airtight apparatus according to claim 1, wherein the metal film formed on the package and the metal film formed on the lid are directly bonded to each other after foreign substances have been removed from surfaces of the metal films.

5. The airtight apparatus according to claim 4, wherein the foreign substances are removed from the surfaces of the metal films by applying an energy wave to the metal films formed on the package and the lid, respectively.

6. The airtight apparatus according to claim 1, wherein a metal film is formed on the lid, at a position where the lid abuts on a metal film formed on the package.

7. The airtight apparatus according to claim 6, wherein the metal film formed on the lid is composed of a base layer, an Ni layer formed on the base layer, and an Au layer formed on the Ni layer.

8. The airtight apparatus according to claim 6, wherein a brazing layer used as a bonding material is interposed between the metal film formed on the package and the metal film formed on the lid.

9. The airtight apparatus according to claim 6, wherein the metal film formed on the package and the metal film formed on the lid are directly bonded to each other after foreign substances have been removed from surfaces of the metal films.

10. The airtight apparatus according to claim 9, wherein the foreign substances are removed from the surfaces of the metal films by applying an energy wave to the metal films formed on the package and the lid, respectively.

11. An airtight apparatus comprising:
a package; and
a lid which is bonded to the package and defines an airtight space, together with the package, and which includes:
an optical window which allows the passage of optical signals;
a holding part which holds the optical window, the holding part and
having a thinner portion part which is formed on an entire outer circumferential edge of the holding part and which is able to deform when applied with a load smaller than a load that deforms other portions of the holding part;
wherein the thinner portion is similar in shape to a metal film formed on the package and a metal film is formed on the lid at a position where the lid abuts on the metal film formed on the package.

12. The airtight apparatus according to claim 11, wherein the metal film formed on the lid is composed of a base layer, an Ni layer formed on the base layer, and an Au layer formed on the Ni layer.

13. The airtight apparatus according to claim 11, wherein a brazing layer used as a bonding material is interposed between the metal film formed on the package and the metal film formed on the lid.

14. The airtight apparatus according to claim 11, wherein the metal film formed on the package and the metal film formed on the lid are directly bonded to each other after foreign substances have been removed from surfaces of the metal films.

15. The airtight apparatus according to claim 14, wherein the foreign substances are removed from the surfaces of the metal films by applying an energy wave to the metal films formed on the package and the lid, respectively.

* * * * *